United States Patent
Yamamoto et al.

(10) Patent No.: US 6,699,572 B2
(45) Date of Patent: Mar. 2, 2004

(54) METAL FILM/AROMATIC POLYIMIDE FILM LAMINATE

(75) Inventors: Tomohiko Yamamoto, Yamaguchi (JP); Toshihiko Anno, Yamaguchi (JP); Toshiyuki Nishino, Yamaguchi (JP); Takashi Amane, Yamaguchi (JP)

(73) Assignee: Ube Industries, Ltd., Yamaguchi (JP)

( * ) Notice: Subject to any disclaimer, the term of this patent is extended or adjusted under 35 U.S.C. 154(b) by 0 days.

(21) Appl. No.: 09/957,869

(22) Filed: Sep. 21, 2001

(65) Prior Publication Data

US 2002/0090524 A1 Jul. 11, 2002

(30) Foreign Application Priority Data

Sep. 21, 2000 (JP) ........................................ 2000-286456

(51) Int. Cl.$^7$ ............................. B32B 7/02; B32B 15/08

(52) U.S. Cl. ..................... 428/216; 428/213; 428/214; 428/215; 428/335; 428/336; 428/458; 428/473.5

(58) Field of Search .................................. 428/213, 214, 428/215, 216, 332, 335, 336, 458, 473.5

(56) References Cited

U.S. PATENT DOCUMENTS 6,251,507 B1 * 6/2001 Yamamoto et al. ......... 428/215

\* cited by examiner

*Primary Examiner*—D. S. Nakarani
(74) *Attorney, Agent, or Firm*—Reed Smith LLP

(57) ABSTRACT

A metal film/aromatic polyimide film laminate is composed of a composite aromatic polyimide film and a metal film, in which the composite aromatic polyimide film is composed of an aromatic polyimide substrate film having a linear expansion coefficient of $5 \times 10^{-6}$ to $30 \times 10^{-6}$ cm/cm/° C. in the temperature range of 50–200° C. (measured in machine direction), and a thin aromatic polyimide layer of polyimide prepared from a carboxylic acid component comprising a mixture of 3,3',4,4'-biphenyltetracarboxylic dianhydride and 2,3,3',4'-biphenyltetracarboxylic dianhydride in a molar ratio of 50:50 to 90:10 and an aromatic diamine component composed of 1,3-bis(4-aminophenoxy)benzene or a mixture of 1,3-bis(4-aminophenoxy)benzene and p-phenylenediamine and/or diaminodiphenyl ether in a molar ratio of 10/90 or more. Tg of the thin polyimide layer is 210–310° C. The metal film is fixed to the thin polyimide layer at a 90° peel resistance of 0.5 kg/cm or higher, while the thin polyimide layer is bonded to the substrate film at a 90° peel resistance higher than that between the metal film and the thin layer.

15 Claims, No Drawings

METAL FILM/AROMATIC POLYIMIDE FILM LAMINATE

CROSS-REFERENCES TO RELATED APPLICATIONS

This application claims priority of Japanese Application No. 2000-286456 filed Sep. 21, 2000, the complete disclosure of which is hereby incorporated by reference.

FIELD OF THE INVENTION

This invention relates to a metal film/aromatic polyimide film laminate and further relates to a composite aromatic polyimide film.

BACKGROUND OF THE INVENTION

Aromatic polyimide films show good high temperature resistance, good chemical properties, high electrical insulating property, and high mechanical strength, and therefore are widely employed in various technical fields. For instance, an aromatic polyimide film is favorably employed in the form of a continuous aromatic polyimide film/metal film composite sheet for manufacturing a flexible printed circuit board (FPC), a carrier tape for tape-automated-bonding (TAB), and a tape of lead-on-chip (LOC) structure.

The aromatic polyimide film/metal film laminate can be produced by bonding a polyimide film to a metal film using a conventional adhesive such as an epoxy resin. However, due to low heat-resistance of the conventional adhesive, the produced composite sheet cannot show satisfactory high heat-resistance.

For obviating the above-mentioned problem, a variety of bonding methods have been proposed. For instance, an aromatic polyimide film/metal film composite sheet is manufactured by producing a copper metal film on an aromatic polyimide film by electroplating. Otherwise, an aromatic polyamide solution (i.e., a solution of a precursor of an aromatic polyimide resin) is coated on a copper film, dried, and heated for producing an aromatic polyimide film on the copper film.

An aromatic polyimide film/metal film composite sheet also can be produced using a thermoplastic polyimide resin.

U.S. Pat. No. 4,543,295 describes that a metal film/aromatic polyimide film laminate in which the metal film is bonded to the polyimide film at a high bonding strength is prepared by combining, by heating under pressure, a metal film and a composite aromatic polyimide film composed of a highly heat resistant substrate film and a thermoplastic thin polyimide layer bonded to the substrate film at an extremely high bonding strength. It has been found, however, that some composite aromatic polyimide films have unsatisfactory resistance to a chlorine-containing solvent such as methylene chloride. The methylene chloride and analogous compounds are employed for washing a metal film/aromatic polyimide film laminate before or after etching the laminate.

SUMMARY OF THE INVENTION

It is an object of the invention to provide a metal film/aromatic polyimide film laminate in which a metal film is bonded to an aromatic polyimide film at a high bonding strength, and the aromatic polyimide film has high resistance to a chlorine-containing solvent such as methylene chloride.

The invention resides in a metal film/aromatic polyimide film laminate comprising a composite aromatic polyimide film and a metal film, in which the composite aromatic polyimide film is composed of an aromatic polyimide substrate film having a linear expansion coefficient of $5\times10^{-6}$ to $30\times10^{-6}$ cm/cm/°C. in the temperature range of 50 to 200° C., the coefficient being a value measured in a machine direction of the substrate film, and a thin aromatic polyimide layer comprising polyimide prepared from a carboxylic acid component comprising a mixture of 3,3',4,4'-biphenyltetracarboxylic dianhydride and 2,3,3',4'-biphenyltetracarboxylic dianhydride in a molar ratio of 50:50 to 90:10 and an aromatic diamine component comprising 1,3-bis(4-aminophenoxy)benzene or a mixture of 1,3-bis(4-aminophenoxy)benzene and at least one diamine component selected from the group consisting of p-phenylenediamine and diaminodiphenyl ether in a molar ratio of 10/90 or more, the polyimide of the thin aromatic polyimide layer having a glass transition temperature of 210 to 310° C., and the metal film being fixed to the thin aromatic polyimide layer at a 90° peel resistance of 0.5 kg/cm or higher, while the thin polyimide layer being bonded to the polyimide substrate film at a 90° peel resistance higher than the peel resistance between the metal film and the thin polyimide layer.

The invention further resides in a process comprising etching the metal film of the metal film/aromatic polyimide film laminate of the invention and washing the etched laminate with a chlorine-containing solvent.

The invention furthermore resides in a process comprising washing the metal film of the metal film/aromatic polyimide film laminate of the invention with a chlorine-containing solvent and etching the washed laminate.

The invention furthermore resides in a composite aromatic polyimide film composed of an aromatic polyimide substrate film having a linear expansion coefficient of $5\times10^{-6}$ to $30\times10^{-6}$ cm/cm/°C. in the temperature range of 50 to 200° C., the coefficient being a value measured in a machine direction of the substrate film, and a thin aromatic polyimide layer comprising polyimide prepared from a carboxylic acid component comprising a mixture of 3,3',4,4'-biphenyltetracarboxylic dianhydride and 2,3,3',4'-biphenyltetracarboxylic dianhydride in a molar ratio of 50:50 to 90:10 and an aromatic diamine component comprising 1,3-bis(4-aminophenoxy)benzene or a mixture of 1,3-bis(4-aminophenoxy)benzene and at least one diamine component selected from the group consisting of p-phenylenediamine and diaminodiphenyl ether in a molar ratio of 10/90 or more, the polyimide of the thin aromatic polyimide layer having a glass transition temperature of 210 to 310° C., and the thin polyimide layer being bonded to the polyimide substrate under the condition that the thin polyimide layer cannot be peeled off from the polyimide substrate film without breakage of the thin polyimide layer.

DETAILED DESCRIPTION OF THE INVENTION

The metal film/aromatic polyimide film laminate of the invention comprises a composite aromatic polyimide film and a metal film.

The composite aromatic polyimide film is composed of an aromatic polyimide substrate film having a relatively low linear expansion coefficient such as $5\times10^{-6}$ to $30\times10^{-6}$ cm/cm/°C. in the temperature range of 50 to 200° C. (measured in a machine direction of the substrate film), and a thin aromatic polyimide layer comprising polyimide on which a metal film can be bonded by heating under pressure or a metal film can be formed by vacuum deposition or chemical plating. The thin aromatic polyimide layer can be provided to both surfaces of the substrate film. Therefore, a metal film can be fixed to each thin polyimide layer on both sides of the composite film.

The thin aromatic polyimide layer has a thickness less than the thickness of the substrate film. The polyimide substrate has a thickness generally in the range of 5 to 125 $\mu$m, and the thin polyimide layer generally has a thickness of 1 to 25 $\mu$m, preferably 1 to 15 $\mu$m, more preferably 2 to 12 $\mu$m. The thickness of the composite polyimide film generally is in the range of 7 to 125 $\mu$m, preferably 7 to 50 $\mu$m, more preferably 7 to 25 $\mu$m.

The metal film is fixed to the thin aromatic polyimide layer at a 90° peel resistance of 0.5 kg/cm or more, preferably 0.7 kg/cm or more, more preferably 1.0 kg/cm or more, while the thin polyimide layer is bonded to the polyimide substrate film at a 90° peel resistance higher than the peel resistance between the metal film and the thin polyimide layer. The bonding between the thin polyimide layer and the substrate film preferably is extremely strong so that the thin polyimide layer cannot be peeled off from the substrate film without breakage of the thin polyimide layer.

The polyimide of the thin polyimide layer is prepared from a carboxylic acid component comprising a mixture of 3,3',4,4'-biphenyltetracarboxylic dianhydride and 2,3,3',4'-biphenyltetracarboxylic dianhydride in a molar ratio of 50:50 to 90:10, preferably 60:40 to 90:10, and an aromatic diamine component comprising 1,3-bis(4-aminophenoxy)benzene or a mixture of 1,3-bis(4-aminophenoxy)benzene and at least one diamine component selected from the group consisting of p-phenylenediamine and diaminodiphenyl ether in a molar ratio of 10/90 or more, preferably 25/75 or more. The polyimide of the thin aromatic polyimide layer has a glass transition temperature of 210 to 310° C., preferably 210 to 260° C.

In more detail, the polyimide of the thin polyimide layer is prepared from one of the following combinations of the carboxylic acid component and the diamine component:

1) a carboxylic acid component comprising a mixture of 3,3',4,4'-biphenyltetracarboxylic dianhydride and 2,3,3',4'-biphenyltetracarboxylic dianhydride in a molar ratio of 50:50 to 90:10 and 1,3-bis(4-aminophenoxy)benzene;

2) a carboxylic acid component comprising a mixture of 3,3',4,4'-biphenyltetracarboxylic dianhydride and 2,3,3',4'-biphenyltetracarboxylic dianhydride in a molar ratio of 50:50 to 90:10 and an aromatic diamine component comprising a mixture of 1,3-bis(4-aminophenoxy)benzene and p-phenylenediamine in a molar ratio of 10/90 or more;

3) a carboxylic acid component comprising a mixture of 3,3',4,4'-biphenyltetracarboxylic dianhydride and 2,3,3',4'-biphenyltetracarboxylic dianhydride in a molar ratio of 50:50 to 90:10 and an aromatic diamine component comprising a mixture of 1,3-bis(4-aminophenoxy)benzene and diaminodiphenyl ether in a molar ratio of 10/90 or more; and 4) a carboxylic acid component comprising a mixture of 3,3',4,4'-biphenyltetracarboxylic dianhydride and 2,3,3',4'-biphenyltetracarboxylic dianhydride in a molar ratio of 50:50 to 90:10 and an aromatic diamine component comprising a mixture of 1,3-bis(4-aminophenoxy)benzene (TPE-R), p-phenylenediamine (PPD) and diaminodiphenyl ether (DADE) in a molar ratio of 10/90 or more, in terms of a molar ratio of TPE-R/(PPD+DADE).

The polyimide of the thin polyimide layer preferably does not melt at temperatures between its glass transition temperature (Tg) and 300° C., and preferably shows a modules of elasticity of 0.001 to 0.5 time at 275° C., based on a modules of elasticity measured at 50° C.

The polyimide substrate film having a relatively low linear expansion coefficient preferably shows no observable glass transition temperature or preferably has a glass transition temperature of higher than 310° C., more preferably higher than 315° C., most preferably 350° C. or higher. The polyimide substrate film preferably comprises polyimide prepared from a 3,3',4,4'-biphenyltetracarboxylic dianhydride and an aromatic diamine component comprising p-phenylenediamine or a mixture of p-phenylenediamine and diaminodiphenyl ether in a molar ratio of 70/30 or more.

The substrate film preferably has a linear expansion coefficient (in the machine direction, MD) in the range of $15 \times 10^{-6}$ to $25 \times 10^{-6}$ cm/cm/° C., in the temperature range of 50 to 200° C. A modules of tensile elasticity (MD, according to ASTM-DB82) of the substrate film preferably is not less than 300 kg/mm$^2$, more preferably 500 to 1,000 kg/mm$^2$.

The composite polyamide film of the invention can be prepared by the process set forth below.

First, a dope solution for the preparation of the polyimide substrate film and a dope solution for the preparation of the thin polyimide layer is prepared.

For preparing each dope solution, the reactive compounds, i.e., one or more tetracarboxylic dianhydride(s) and one or more diamine compound(s), are caused to react in an organic solvent at a temperature of approximately 100° C. or lower, preferably at a temperature of 20 to 60° C., so as to produce a polyamide acid (or polyamic acid), namely, a polyimide precursor. The polyamide acid solution or its diluted solution is employed as the dope solution.

The composite polyimide film of the invention can be manufactured by co-extruding each dope solution continuously from a dye having multiple slits to place a wet dope film composed of plural dope solutions on a metallic belt support. Each dope solution preferably contains the polyamide acid in an amount of 1 to 20 wt. %. The dope solution film is heated to a temperature of 50 to 400° C. for 1 to 30 min., so as to evaporate the solvent and further produce the desired composite polyimide film by way of cyclization reaction.

Otherwise, the composite polyimide film of the invention can be manufactured by first preparing a dope solution film for the substrate film or thin polyimide layer and placing on the dope solution film a different dope solution, that is, for the thin polyimide film or substrate film. Thus produced composite dope solution film is heated to a temperature of 50 to 400° C. for 1 to 30 min., so as to evaporate the solvent and further produce the desired composite polyimide film by way of cyclization reaction.

In the preparation of the polyamide acid for the thin polyimide layer or the substrate film, relatively small amounts of other aromatic tetracarboxylic dianhydrides and/or diamine compounds may be employed in combination, in addition to the above-identified aromatic tetracarboxylic dianhydride(s) and diamine compound(s), provided that no essential change of characteristics is brought about in the obtainable polyimide. Examples of the optionally employable aromatic tetracarboxylic dianhydrides include pyromellitic dianhydride (PMDA) and 3,3',4,4'-benzophenonetetracarboxylic dianhydride (BTDA). The optionally employable tetracarboxylic component can be employed in an amount of 20 molar % or less, particularly 10 mol. % or less, per the total amount of the tetracarboxylic acid components.

Examples of the optionally employable diamine compounds include aromatic diamines which have a flexible molecular structure and contain plural benzene rings, such as 4,4'-diaminobenzophenone, 4,4'-diaminodiphenylmethane, 2,2-bis(4-aminophenyl)propane, 1,4-bis(4-aminophenoxy) benzene, 4,4'-bis(4-aminophenyl)diphenyl ether, 4,4'-bis(4-aminophenyl)diphenylmethane, 4,4'-bis(4-aminophenoxy) diphenyl ether, 4,4'-bis(4-aminophenoxy)diphenylmethane, 2,2-bis [4-(aminophenoxy)phenyl]propane, and 2,2-bis [4-(4-aminophenoxy)phenyl]hexafluoropropane; aliphatic amines, such as 1,4-diaminobutane, 1,6-diaminohexane, 1,8-diaminooctane, 1,4-diaminodecane, and 1,12-diaminododecane; and diaminosiloxanes, such as bis(3-aminopropyl)tetramethyldisiloxane. The optionally employable diamine compound can be employed in an amount of 20 molar % or less, particularly 10 mol. % or less, per the total amount of the diamine compounds.

Further, a gelation-inhibiting agent such as a phosphorus-containing stabilizer (e.g., triphenyl phosphite, or triphenyl phosphate) may be employed in the process of polymerization of the polyamide acid, in an amount of 0.01 to 1%, based on the amount of the polyamide acid. Also, an imidizing agent such as a basic organic catalyst (e.g., imidazole, 2-imidazole, 1,2-dimethylimidazole, or 2-phenylimidazole) may be added to the dope solution (i.e., polyamide acid solution) in an amount of 0.05 to 10 wt. %, particularly 0.1 to 2 wt. %, based on the amount of the polyamide acid. The imidizing agent is effective to well imidize the polyamide acid at a relatively low temperature.

In addition, a metal compound such as an organic aluminum compound (e.g., aluminum triacetylacetonate), an inorganic aluminum compound (e.g., aluminum hydroxide), or an organic tin compound may be incorporated into the dope solution in an amount of 1 ppm or more (in terms of the amount of metal), particularly 1 to 1,000 ppm, based on the amount of the polyamide acid, so that the thermoplastic polyimide layer can be bonded to a metal film at a higher bonding strength.

The preparation of the polyamide acid can be performed in an organic solvent such as N-methyl-2-pyrollidone, N,N-dimethylformamide, N,N-dimethylacetamide, N,N-diethylacetamide, dimethylsulfoxide, hexamethylphosphoramide, N-methylcaprolactam, or cresol or its derivative. The organic solvents can be employed singly or in combination.

The composite polyimide film of the invention preferably has a linear expansion coefficient (MD, 50–200° C.) of $30 \times 10^{-6}$ cm/cm/° C. or less, preferably $15 \times 10^{-6}$ to $25 \times 10^{-6}$ cm/cm/° C. and a modulus tensile elasticity (MD, ASTM-D882) of 300 kg/mm² or more.

On the thin polyimide layer of the composite polyimide film is placed a metal film. The metal film preferably has a thickness of 3 to 30 μm.

Examples of the metal films include copper film, aluminum film, iron film, stainless steel film, gold film, palladium film, or a film of metal alloy. Preferred are an electrolytic copper film, a rolled copper film, a stainless steel film. The metal film preferably has a surface roughness (Rz) of 3 μm or less, more preferably 0.5 to 3 μm, most preferably 1.5 to 3 μm or less. A metal film having such surface roughness is available under the name of VLP or LP (or HTE) for a copper film.

The metal film can be placed by a physico-chemical process such as vacuum deposition, electron beam deposition, sputtering, or a chemical process such as chemical plating. The physico-chemical process is preferably performed at a pressure of $10^{-7}$ to $10^{-2}$ Torr and a deposition rate of 50 to 5,000 angstroms per sec. In the deposition procedure, the composite polyimide film is preferably kept at a temperature of 20 to 600° C. RF magneto sputtering at a pressure of $10^{-3}$ to $10^{-2}$ Torr is preferably employed, keeping the composite polyimide film at a temperature of 20 to 450° C. and adjusting the deposition rate at 0.5 to 500 angstrom per se. The chemical plating and the physico-chemical deposition can be employed in combination.

The thin polyimide layer of the composite polyimide film is preferably subjected to surface treatment such as plasma discharge treatment or corona discharge treatment.

The metal film/aromatic polyimide film laminate of the invention is preferably produced by the steps of:
  placing a metal film on the thin polyimide layer of the composite polyimide film, and
  pressing under heating the combination of the metal film and the composite polyimide film.

The double belt press is preferably employed for the procedure of pressing under heating. A representative double belt press is described in U.S. Pat. No. 4,599,128, and is commercially available from Held Corporation (Germany).

The metal film/composite polyimide film laminate of the invention preferably is a continuous late having a width of approx. 400 mm or more, more preferably 500 mm or more.

The metal film/composite polyimide film laminate of the invention can be subjected to etching for removing a portion of the metal film. Before or after the etching, the metal film/composite polyimide film laminate can be washed with a chlorine-containing solvent such as methylene chloride.

After the laminate is subjected to etching, the composite polyimide film is subjected to punching procedure, alkali etching, or laser-beam boring procedure for forming through-holes. These procedures for the production of through-holes are well known.

The invention is further described by the following examples.

In the following examples, the physical and chemical characteristics were determined by the methods described below:

Glass transition temperature (Tg): determined by peak temperature of Tan δ using dynamic viscoelastometer;

Peeling strength: 90° peeling at a rate of 50 mm/min;

Resistance to methylene chloride:
  Weight loss: A sample is weighed, placed in methylene chloride at 25° C. for 5 minutes, taken out, dried under reduced pressure for 2 hours at room temperature, and weighed. Weight loss (detectable lower limit: ±0.5 wt. %) is calculated by dividing decrease of weight from the initial weight to the final weights by the initial weight and multiplying with 100;
  Appearance after the contact to methylene chloride was observed for examining whether the appearance is changed upon the contact or not.

EXAMPLE 1

Production of Metal Film/Polyimide Film Laminate

[Preparation of Composite Polyimide Film]

(1) Preparation of Dope for Polyimide Substrate Film

In a reaction vessel equipped with a stirrer and a nitrogen gas inlet were successively placed N,N-dimethylacetamide (DMAc) and a mixture of p-phenylenediamine (PPD) and 3,3',4,4'-biphenyltetracarboxylic dianhydride (s-BPDA) [1000:988, molar ratio, in an amount to give a DMAc solution containing the mixture at 18 wt %]. The resulting mixture was kept at 50° C. for 3 hrs. under stirring, to give a viscous brown dope having a solution viscosity of approx. 1,500 poise (at 25° C.).

A portion of the resulting solution was converted to a polyimide film of 50 μm thick which had a linear expansion coefficient (MD, 50–200° C., at a temperature elevation of 5° C./min.) of 15×10$^{-6}$ cm/cm/° C. and a modulus elasticity in tension (MD, ASIM-D882) of 756 kg/mm$^2$.

(2) Preparation of Dope for Thin Polyimide Layer

In a reaction vessel equipped with a stirrer and a nitrogen gas inlet were successively placed N,N-dimethylacetamide (DMAc), 1,3-bis(4-aminophenoxy)benzene (TPE-R), and a mixture of 3,3',4,4'-biphenyltetracarboxylic dianhydride (s-BPDA) and 2,3,3',4'-biphenyltetracarboxylic dianhydride (a-BPDA) [50:50, molar %], in which the molar ratio of the TPE-R and the mixture of a-BPDA and s-BPDA was 1000:992. In the resulting mixture, the concentration of the total amount of TPE-R, a-BPDA and s-BPDA was 22%. Further, triphenylphosphate was added in an amount of 0.1 wt. % per the amount of the above-mentioned mixture). The resulting mixture was kept at 25° C. for 4 hours under stirring, to give a polyamide solution having a solution viscosity of approx. 1,500 poise (at 25° C.).

A portion of the resulting solution was converted to a polyimide film which had Tg of 250° C.

(3) Production of Composite Polyimide Film

The two dope solutions prepared above were simultaneously extruded onto a continuous metal belt from a manifold die, and the resulting dope solution films were continuously dried by air (heated to 140° C.), until the solution films were solidified and united. The united films were separated from the metal belt and heated in a heating furnace at gradually increased temperatures of 200° C. to 350° C. In the course of heating, the solvent was evaporated and imidization was performed. Thus produced continuous two layered composite polyimide film had total thickness of 35 μm, in which thickness of substrate film was 25 μm and thickness of thin polyimide layer was 10

(4) Manufacture of Metal Film/Polyimide Film Laminate

On the thin polyimide layer of the composite polyimide film were placed, in order, a copper film (thickness: 35 μm) and an aluminum film (thickness: 12 μm). The resulting laminate was pressed at a temperature of 340° C. and a pressure of 50 kgf/cm$^2$ for 5 min., to give a metal film/polyimide film laminate.

The glass transition temperature (Tg), resistance to methylene chloride, and 90° peeling strength of the metal film/polyimide film laminate are set forth in Table 1.

EXAMPLE 2

A composite polyimide film was prepared in the same manner as in Example 1 except for changing the molar ratio of s-BPDA/a-BPDA to 65/35.

A portion of the dope solution for thin polyimide layer was converted to a polyimide film which had Tg of 245° C.

Tg and other characteristics measured on the obtained metal film/polyimide film laminate are set forth in Table 1.

EXAMPLE 3

A composite polyimide film was prepared in the same manner as in Example 1 except for changing the molar ratio of s-BPDA/a-BPDA to 75/25.

A portion of the dope solution for thin polyimide layer was converted to a polyimide film which had Tg of 242° C.

Tg and other characteristics measured on the obtained metal film/polyimide film laminate are set forth in Table 1.

EXAMPLE 4

A composite polyimide film was prepared in the same manner as in Example 1 except for changing the molar ratio of s-BPDA/a-BPDA to 85/15.

A portion of the dope solution for thin polyimide layer was converted to a polyimide film which had Tg of 224° C.

Tg and other characteristics measured on the obtained metal film/polyimide film laminate are set forth in Table 1.

COMPARISON EXAMPLE 1

A composite polyimide film was prepared in the same manner as in Example 1 except for replacing the mixture of s-BPDA/a-BPDA with a-BPDA only.

A portion of the dope solution for thin polyimide layer was converted to a polyimide film which had Tg of 259° C.

Tg and other characteristics measured on the obtained metal film/polyimide film laminate are set forth in Table 1.

COMPARISON EXAMPLE 2

A composite polyimide film was prepared in the same manner as in Example 1 except for changing the molar ratio of s-BPDA/a-BPDA to 25/85.

A portion of the dope solution for thin polyimide layer was converted to a polyimide film which had Tg of 254° C.

Tg an other characteristics measured on the obtained metal film/polyimide film laminate are set fort in Table 1.

COMPARISON EXAMPLE 3

A composite polyimide film was prepared in the same manner as in Example 1 except for replacing the mixture of s-BPDA/a-BPDA with s-BPDA only.

A portion of the dope solution for thin polyimide layer was converted to a polyimide film which had Tg of 232° C.

Tg and other characteristics measured on the obtained metal film/polyimide film laminate are set forth in Table 1.

TABLE 1

| Sample | Weight loss (%) | Appearance | Peel strength (kg/cm) |
| --- | --- | --- | --- |
| Ex. 1 | <±0.5 | no change | 1.1 |
| Ex. 2 | <±0.5 | no change | 1.1 |
| Ex. 3 | <±0.5 | no change | 1.3 |
| Ex. 4 | <±0.5 | no change | 1.2 |
| Com. 1 | −16.9 | turned white | 0.9 |
| Com. 2 | −1.3 | turned white | 1.2 |
| Com. 3 | <±0.5 | no change | 0.1 |

EXAMPLE 5

A composite polyimide film was prepared in the same manner as in Example 1 except for replacing 1,3-bis(4-aminophenoxy)benzene (TPE-R) with a combination of TPE-R and 4,4'-diaminodiphenyl ether in a molar ratio of 75/25 (TPE-R/DADE).

A portion of the dope solution for thin polyimide layer was converted to a polyimide film which had Tg of 267° C.

Tg and other characteristics measured on the obtained metal film/polyimide film laminate are set forth in Table 2.

EXAMPLE 6

A composite polyimide film was prepared in the same manner as in ample 1 except for replacing 1,3-bis(4-aminophenoxy)benzene (TPE-R) with a combination of TPE-R and 4,4'-diaminodiphenyl ether in a molar ratio of 50/50 (TPE-R/DADE).

A portion of the dope solution for thin polyimide layer was converted to a polyimide film which had Tg of 280° C.

Tg and other characteristics measured on the obtained metal film/polyimide film laminate are set forth in Table 2.

EXAMPLE 7

A composite polyimide film was prepared in the same manner as in Example 1 except for replacing 1,3-bis(4-aminophenox)benzene (TPE-R) with a combination of TPE-R and 4,4'-diaminodiphenyl ether in a molar ratio of 25/75 (TPE-R/DADE).

A portion of the dope solution for thin polyimide layer was converted to a polyimide film which had Tg of 297° C.

Tg and other characteristics measured on the obtained metal film/polyimide film laminate are set forth in Table 2.

TABLE 2

| Sample | Weight loss (%) | Appearance | Peel strength (kg/cm) |
|---|---|---|---|
| Ex. 5 | <±0.5 | no change | 0.8 |
| Ex. 6 | <±0.5 | no change | 0.9 |
| Ex. 7 | <±0.5 | no change | 0.8 |

EXAMPLE 8

A composite polyimide film was prepared in the same manner as in Example 1 except for replacing 1,3-bis(4-aminophenoxy)benzene (TPE-R) with a combination of TPE-R and p-phenylenediamine in a molar ratio of 10/90 (TPE-R/PPD).

A portion of the dope solution for thin polyimide layer was converted to a polyimide film which had Tg of 253° C.

Tg and other characteristics measured on the obtained metal film/polyimide film laminate are set forth in Table 3.

EXAMPLE 9

A composite polyimide film was prepared in the same manner as in Example 1 except for replacing 1,3-bis(4-aminophenoxy)benzene (TPE-R) with a combination of TPE-R and p-phenylenediamine in a molar ratio of 50/50 (TPE-R/PPD).

A portion of the dope solution for thin polyimide layer was converted to a polyimide film which had Tg of 280° C.

Tg and other characteristics measured on the obtained metal film/polyimide film laminate are set forth in Table 3.

TABLE 3

| Sample | Weight loss (%) | Appearance | Peel strength (kg/cm) |
|---|---|---|---|
| Ex. 8 | <±0.5 | no change | 1.1 |
| Ex. 9 | <±0.5 | no change | 0.9 |

EXAMPLE 10

A composite polyimide film consisting of one thin polyimide layer (thickness: 4 $\mu$m), a substrate film (thickness. 10 $\mu$m), and another thin polyimide layer (4 $\mu$m), in order) was produced using the dope solutions prepared in Example 1.

The composite polyimide film was placed between a pair of electrolytic copper foil (3EC-VLP, Rz: 3.8 $\mu$m), continuously supplied into a double belt press, and heated under pressing. The conditions were as follows:

preheating—heating at highest temperature set to 380° C.—cooling at lowest temperature of 117° C.

Thus obtained metal film/polyimide film laminate roll (width: approx. 530 mm) had satisfactory characteristics similar to those obtained in Example 1.

EXAMPLE 11

A composite polyimide film consisting of one thin polyimide layer (thickness: 7 $\mu$m), a substrate polyimide film (thickness: 36 $\mu$m), and another thin polyimide layer (thickness: 7 $\mu$m), in order, was produced using the dope solutions prepared in Example 1.

On one surface of the composite polyimide film was placed a commercially available polyimide film (25 $\mu$m, Upilex 25S, available from Ube Industries, Ltd.).

One another surface of the composite polyimide film was placed a stainless steel film (thickness: 25 $\mu$m, available from Toyo Foil Production Co., Ltd.).

The laminated material was supplied into a vacuum press and pressed at 330° C. and 50 kg/cm$^2$ for 30 minutes. The vacuum press was then cooled with water to room temperature, while the pressure was maintained. The press was opened to atmospheric surrounding, to take out the desired metal film/polyimide film laminate.

Subsequently, on the free surface of the stainless steel film was coated A-varnish (polyamide acid solution (concentration: 18 wt. %) prepared from s-BPDA and DADE in N-methyl-2-pyrrolidone) using a roll coater to give a solution film of 200 $\mu$m thick). The coated laminate was heated to 120° C. for 30 min., 150° C. for 10 min., 200° C. for 10 min., 250° C. for 10 min., and 350° C. for 10 min. Thus heated laminate was cooled under atmospheric conditions, to give the laminate having a polyimide coat of 25 $\mu$m thick. This was a stainless steel film/polyimide film laminate for heating apparatus.

The resulting laminate was observed to confirm that no change was seen not only on the surface of the stainless steel but also on the surface of the composite polyimide film. The bonding strength between the composite polyimide film and the stainless steel film was 0.72 kg/cm (90° peel strength, 3 mm width tape, n=3).

The Upilex film was easily separated from the composite polyimide film (bonding strength: approx. 5 g/cm).

What is claimed is:

1. A metal film/aromatic polyimide film laminate comprising a composite aromatic polyimide film and a metal film, in which the composite aromatic polyimide film is composed of an aromatic polyimide substrate film having a linear expansion coefficient of $5\times10^{-6}$ to $30\times10^{-6}$ cm/cm/° C. in the temperature range of 50 to 200° C., the coefficient being a value measured in a machine direction of the substrate film, and a thin thermoplastic aromatic polyimide layer having a thickness less than the thickness of the aromatic polyimide substrate film and comprising polyimide prepared from a carboxylic acid component comprising a mixture of 3,3',4,4'-biphenyltetracarboxylic dianhydride and 2,3,3',4'-biphenyltetracarboxylic dianhydride in a molar ratio of 50:50 to 90:10 and an aromatic diamine component comprising 1,3-bis(4-aminophenoxy)benzene or a mixture of 1,3-bis(4-aminophenoxy)benzene and at least one diamine component selected from the group consisting of p-phenylenediamine and diaminodiphenyl ether in a molar ratio of 10/90 or more, the polyimide of the thin aromatic polyimide layer having a glass transition temperature of 210 to 310° C., and the metal film being fixed to the thin aromatic polyimide layer at a 90° peel resistance of 0.5 kg/cm or higher, while the thin polyimide layer being bonded to the polyimide substrate film at a 90° peel resistance higher than the peel resistance between the metal film and the thin polyimide layer.

2. The metal film/aromatic polyimide film laminate of claim 1, wherein the aromatic polyimide substrate film shows no observable glass transition temperature or having a glass transition temperature of higher than 310° C.

3. The metal film/aromatic polyimide film laminate of claim 1, wherein the metal film is fixed to the thin polyimide layer at a 90° peel resistance of 0.7 kg/cm or higher.

4. The metal film/aromatic polyimide film laminate of claim 1 wherein the polyimide of the thin polyimide layer is prepared from a carboxylic acid component comprising a mixture of 3,3',4,4'-biphenyltetracarboxylic dianhydride and 2,3,3',4-biphenyltetracarboxylic dianhydride in a molar ratio of 60:40 to 90:10 and an aromatic diamine component comprising 1,3-bis (4-aminophenoxy) benzene and at least one diamine component selected from the group consisting of p-phenylenediamine and a diaminodiphenyl ether in a molar ratio of 25/75 or more.

5. The metal film/aromatic polyimide film laminate of claim 1, wherein the aromatic polyimide substrate film comprises polyimide prepared from 3,3',4,4'-biphenyltetracarboxylic dianhydride and an aromatic diamine component comprising p-phenylenediamine or a mixture of p-phenylenediamine and diaminodiphenyl ether in a molar ratio of 70/30 or more.

6. The metal film/aromatic polyimide film laminate of claim 1, wherein the aromatic polyimide substrate film has a thickness of 5 to 125 µm and the thin polyimide film has a thickness of 1 to 25 µm.

7. The metal film/aromatic polyimide film laminate of claim 1, wherein the metal film has a thickness of 3 to 35 µm.

8. The metal film/aromatic polyimide film laminate of claim 1, wherein the metal film is a stainless steel film.

9. The metal film/aromatic polyimide film laminate of claim 1, wherein the metal film is laminated on the thin polyimide film by heating under pressure.

10. The metal film/aromatic polyimide film laminate of claim 1, wherein the metal film is vacuum deposited or chemically plated on the thin polyimide film.

11. A composite aromatic polyimide film composed of an aromatic polyimide substrate film having a linear expansion coefficient of $5 \times 10^{-6}$ to $30 \times 10^{-6}$ cm/cm/° C. in the temperature range of 50 to 200° C., the coefficient being a value measured in a machine direction of the substrate film, and a thin thermoplastic aromatic polyimide layer having a thickness less than the thickness of the aromatic polyimide substrate film and comprising polyimide prepared from a carboxylic acid component comprising a mixture of 3,3',4,4'-biphenyltetracarboxylic dianhydride and 2,3,3',4'-biphenyltetracarboxylic dianhydride in a molar ratio of 50:50 to 90:10 and an aromatic diamine component comprising 1,3-bis(4-aminophenoxy)benzene or a mixture of 1,3-bis(4-aminophenoxy)benzene and at least one diamine component selected from the group consisting of p-phenylenediamine and diaminodiphenyl ether in a molar ratio of 10/90 or more, the polyimide of the thin aromatic polyimide layer having a glass transition temperature of 210 to 310° C., and the thin polyimide layer being bonded to the polyimide substrate under the condition that the thin polyimide layer cannot be peeled off from the polyimide substrate film without breakage of the thin polyimide layer.

12. The composite aromatic polyimide film of claim 11, wherein the polyimide substrate film shows no observable glass transition temperature or having a glass transition temperature of higher than 310° C.

13. The composite aromatic polyimide film of claim 11, wherein the polyimide of the thin polyimide layer is prepared from a carboxylic acid component comprising a mixture of 3,3,3',4'-biphenyltetracarboxylic dianhydride in a molar ratio of 60:40 to 90:10 and an aromatic diamine component comprising 1,3-bis (4-aminophenoxy)benzene or a mixture of 1,3-bis (4-aminophenoxy)benzene and at least one diamine component selected from the group consisting of p-phenylenediamine and diaminodiphenyl ether in a molar ratio of 25/75 or more.

14. The composite aromatic polyimide film of claim 11, wherein the polyimide substrate film comprises polyimide prepared from 3,3',4,4'-biphenyltetracarboxylic dianhydride and an aromatic diamine component comprising p-phenylenediamine or a mixture of p-phenylenediamine and diaminodiphenyl ether in a molar ratio of 70/30 or more.

15. The composite aromatic polyimide film of claim 11, wherein the polyimide substrate film has a thickness of 5 to 125 µm and the thin polyimide film has a thickness of 1 to 25 µm.

* * * * *